United States Patent
Panikkar et al.

(10) Patent No.: US 7,009,431 B2
(45) Date of Patent: Mar. 7, 2006

(54) INTERPOLATOR LINEARITY TESTING SYSTEM

(75) Inventors: Adarsh Panikkar, Tacoma, WA (US); Kersi H. Vakil, Olympia, WA (US); Abhimanyu Kolla, Tacoma, WA (US); Arnaud Forestier, Irvine, CA (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 10/879,676

(22) Filed: Jun. 29, 2004

(65) Prior Publication Data

US 2005/0285652 A1    Dec. 29, 2005

(51) Int. Cl.
*H03L 7/06* (2006.01)

(52) U.S. Cl. ............................ 327/156; 327/147; 327/2

(58) Field of Classification Search ........ 327/156–158, 327/2, 147
See application file for complete search history.

(56) References Cited

U.S. PATENT DOCUMENTS

| | | | | |
|---|---|---|---|---|
| 6,114,914 A | * | 9/2000 | Mar ............................. | 331/16 |
| 6,438,721 B1 | * | 8/2002 | Wente ......................... | 714/731 |
| 6,525,615 B1 | * | 2/2003 | Masenas et al. .............. | 331/34 |
| 6,650,157 B1 | * | 11/2003 | Amick et al. ................ | 327/158 |
| 6,815,986 B1 | * | 11/2004 | Roy et al. .................... | 327/149 |

\* cited by examiner

*Primary Examiner*—Dinh T. Le
(74) *Attorney, Agent, or Firm*—Buckley, Maschoff & Talwalkar LLC

(57) ABSTRACT

According to some embodiments, an interpolated clock signal having a first frequency is received, and the interpolated clock signal is periodically sampled based on a reference clock signal to generate periodically-sampled values, the reference clock signal having substantially the first frequency. A phase of the interpolated clock signal may be set to a phase degree at which the periodically-sampled values resolve to more than one value, and the phase of the interpolated clock signal may be incrementally changed until the periodically-sampled values resolve to one value. A non-linearity of the interpolated clock signal may be determined based on the number of incremental changes.

20 Claims, 11 Drawing Sheets

INTERPOLATOR LINEARITY TESTING SYSTEM

BACKGROUND

An interpolator may be used to mix two or more different input signals to provide an output signal. In a transceiver, an interpolator may generate an interpolated clock signal having a desired phase by mixing two or more out-of-phase clock signals. Such an interpolator may be used in conjunction with a tracking loop to extract clock information from a data stream received by the transceiver.

Some interpolators may be controlled to provide an output signal having any one of a linear sequence of phase degrees. For example, an interpolator having thirty-two modes of operation may provide output signals having thirty-two different phase degrees, spaced every 360/32=11.5 degrees. An interpolator exhibiting such linear behavior may be desired in some circumstances. It is currently difficult to efficiently detect non-linear behavior in some types of interpolators.

DETAILED DESCRIPTION

Figure 1:
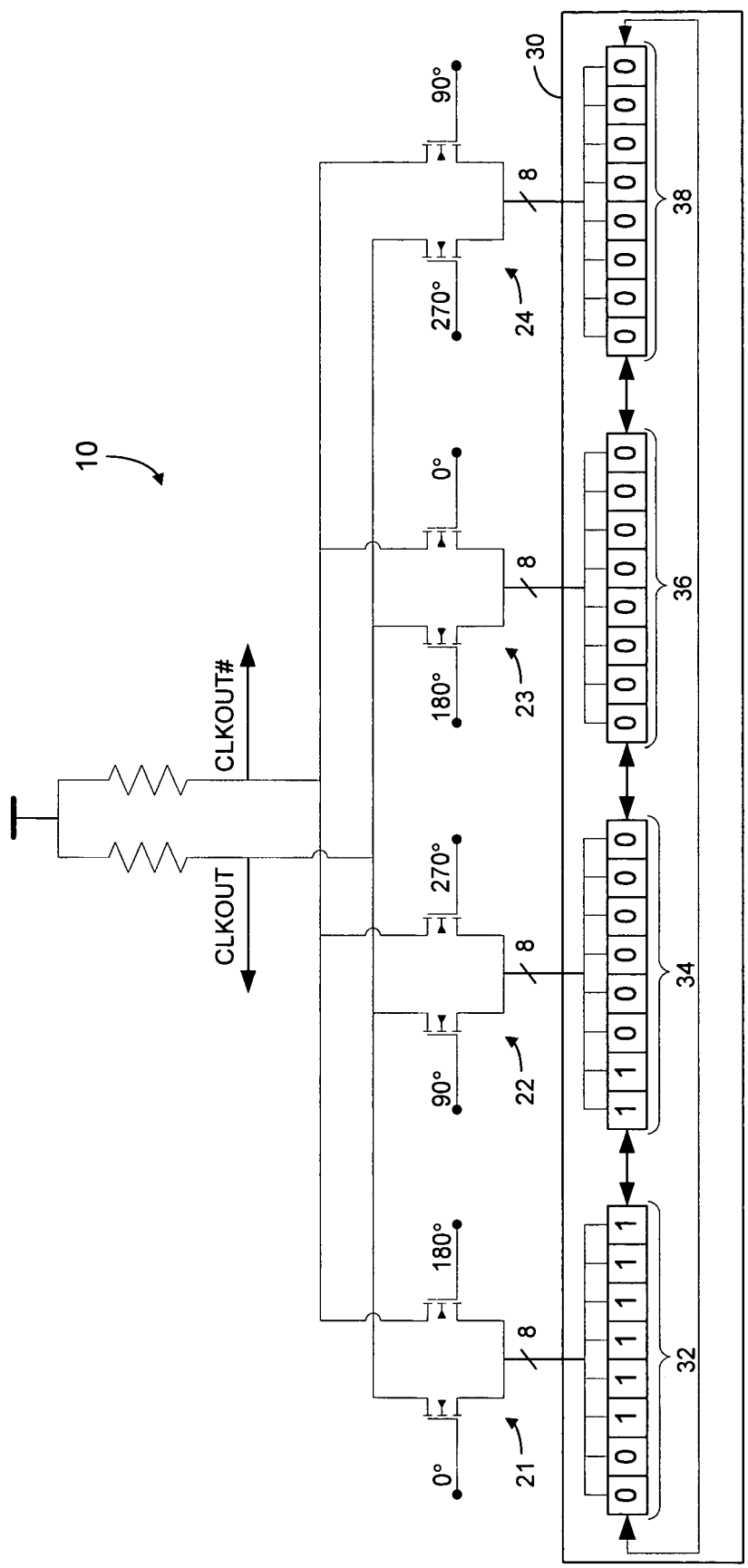
FIG. 1 is a circuit diagram of an interpolator according to some embodiments.

FIG. 1 is a circuit diagram of interpolator 10 according to some embodiments. Interpolator 10 includes pairs 21, 22, 23 and 24 of n-channel metal oxide semiconductor field effect transistors (nMOSFETs) and barrel-shift register 30. Interpolator 10 may operate to receive at least two clock signals having different clock phases and to provide an output clock signal (CLKOUT) having an output clock phase that is based on the at least two received clock signals.

First input terminals of pairs 21, 22, 23 and 24 receive input clock signals with phases 0°, 90°, 180° and 270°, respectively. Second input terminals of pairs 21, 22, 23 and 24 receive input clock signals that are 180° out of phase with the input clock signal received by a respective first input terminal. According to the illustrated example, second input terminals of pairs 21, 22, 23 and 24 receive input clock signals with phases 180°, 270°, 0° and 90°, respectively.

Barrel-shift register 30 comprises thirty-two individual registers. Eight individual registers 32 are coupled to pair 21. Accordingly, eight individual circuits are coupled to pair 21, each of the circuits including a register. Each of these eight circuits shall be referred to herein as an interpolator leg. Similarly, eight interpolator legs comprising registers 34, 36 and 38 are coupled to pairs 22, 23, and 24, respectively.

During some conventional interpolator operation, eight legs of interpolator 10 are activated to determine two input clock phases that will be mixed by interpolator 10. FIG. 1 illustrates the activation of six legs associated with pair 21 and two legs associated with pair 22. As shown, a leg may be activated by asserting a bit of a register associated with the leg. In the illustrated example, output clock signal CLKOUT has an output clock phase that is a weighted mix of 0° and 90°. The output clock phase will be closer to 0° than to 90° since more of the activated legs are associated with pair 21 than with pair 22.

The output clock phase may be changed by barrel-shifting the eight asserted bits through register 30. In the illustrated embodiment, each shift of the eight asserted bits should advance a phase of the output clock signal by a step size of 11.5°. However, implementation errors and/or manufacturing defects may result in unequal step sizes as the bits are shifted through register 30.

Figure 2:
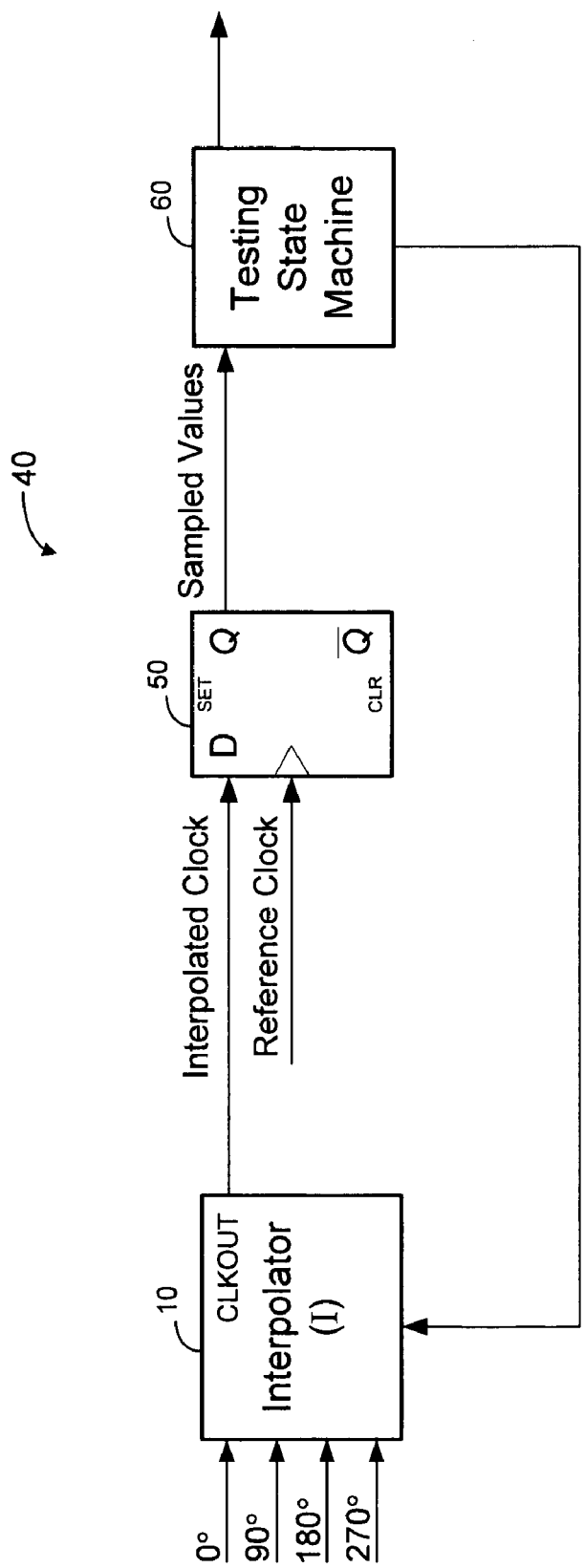
FIG. 2 is a block diagram of a testing system according to some embodiments.

FIG. 2 is a block diagram of a testing system according to some embodiments. Testing system 40 may be used to evaluate the linearity of interpolator 10. Testing system includes interpolator 10, flip-flop 50 and testing state machine 60.

Generally, flip-flop 50 receives an interpolated clock signal from interpolator 10 at its "D" input terminal. Flip-flop 50 also receives a reference clock signal at its clock terminal. The reference clock signal may have substantially the same frequency as the interpolated clock signal. Flip-flop 50 therefore periodically samples the interpolated clock signal based on the reference clock signal. Although flip-flop 50 is illustrated as a D flip-flop, any other suitable flip-flop or latch may be used in conjunction with some embodiments. Flip-flop 50 transmits the periodically-sampled values to testing state machine 60.

Based on the periodically-sampled values, testing state machine 60 sets a phase of the interpolated clock signal to a phase degree at which the periodically-sampled values resolve to more than one value. The phase degree may be one that causes flip-flop 50 to sample the values in a metastable manner.

Figure 3:
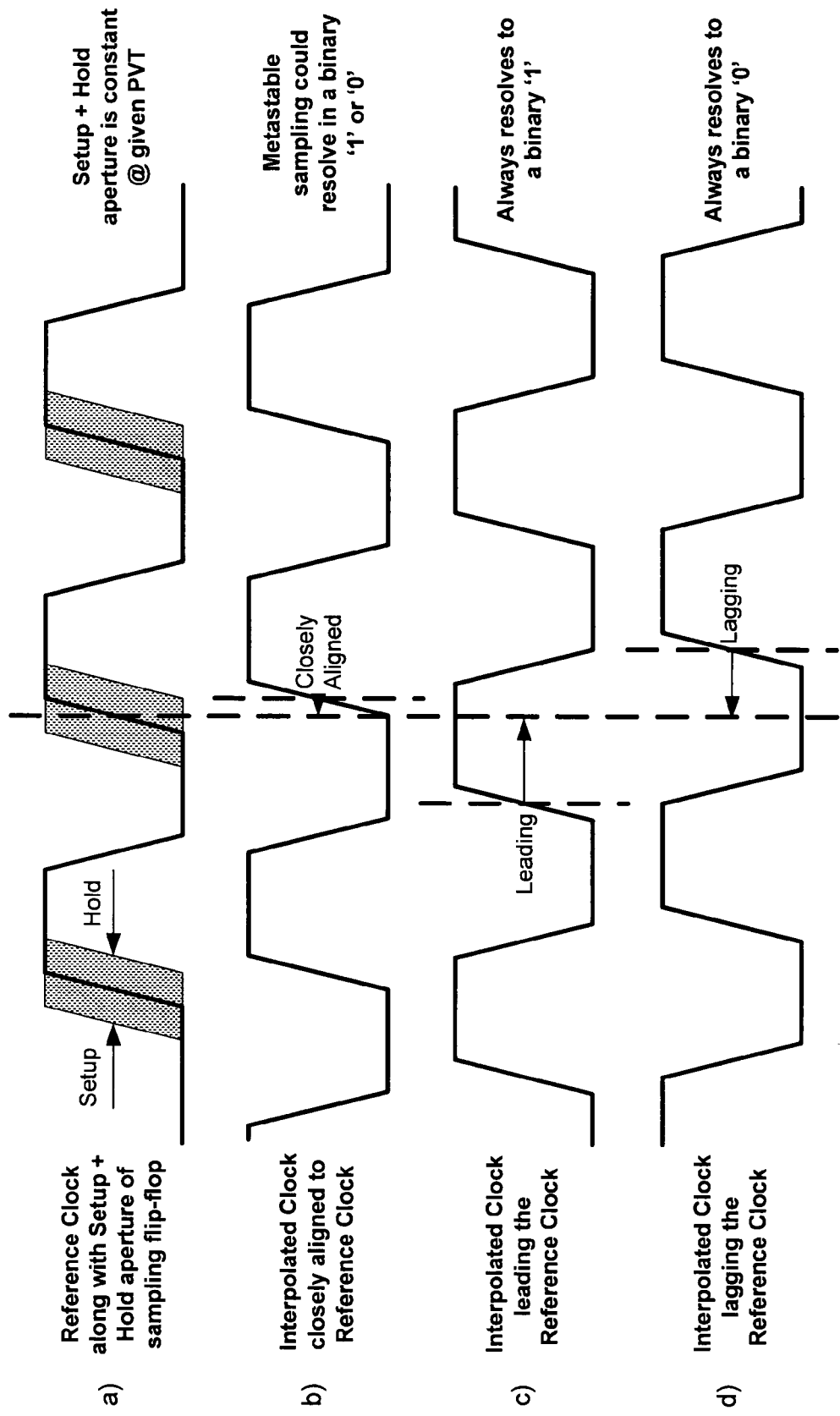
FIG. 3 is a timing diagram to explain a testing process according to some embodiments.

FIG. 3 includes timing diagrams for illustrating metastable operation of flip-flop 50 according to some embodiments. Diagram a) illustrates the reference clock signal as well as setup and hold times associated with flip-flop 50. A setup time is a time period prior to the leading edge of the sampling (reference) clock during which data at the D terminal must be valid to assure valid data at the Q output of flip-flop 50. A hold time is a time period after the leading edge of the sampling (reference) clock during which data at the D terminal must be valid to assure valid data at the Q output.

Together, the setup and hold times represent an aperture window surrounding the leading edge of the sampling (reference) clock. Data that changes at the D input of flip-flop 50 during this window violates either the setup time or the hold time constraint of flip-flop 50. Accordingly, the data is sampled in a metastable manner. As a result, a corresponding sampled value output by flip-flop 50 is either a 1 or a 0, and does not reliably indicate the data present at the D input at the time of sampling.

Diagram b) illustrates a scenario in which a phase of the interpolated clock signal, which is received at the D terminal of flip-flop 50, is closely aligned with a phase of the reference clock. As shown, the interpolated clock signal transitions from 0 to 1 during the aperture window of flip-flop 50. The periodically-sampled values output by flip-flop 50 will comprise a mix of binary 1's and 0's because the sampling is metastable. Therefore, by setting a phase of the interpolated clock signal to a phase degree that results in periodically-sampled values including a mix of binary 1's and 0's, testing state machine 60 may assure metastable operation of flip-flop 50.

After setting the phase as described above, testing state machine 60 incrementally changes the phase of the interpolated clock signal until the periodically-sampled values resolve to one value. Diagrams c) and d) of FIG. 3 illustrate two scenarios in which the periodically-sampled values output by flip-flop 50 will resolve to one value. In diagram c), a phase degree of the interpolated clock signal leads a phase degree of the reference clock signal to an extent that no transitions of the interpolated clock signal (terminal D of flip-flop 50) occur during the aperture window of flip-flop 50. The interpolated clock signal is a binary 1 during the aperture window, so each periodically-sampled value in the illustrated scenario is a binary 1.

Diagram d) shows a phase degree of the interpolated clock signal lagging a phase degree of the reference clock signal to an extent that no transitions of the interpolated clock signal occur during the aperture window. The interpolated clock signal is a binary 0 during the aperture window, so each periodically-sampled value in diagram d) scenario is a binary 0.

Testing state machine 60 may set and change the phase of the interpolated clock signal as described above by instructing shift register 30 of interpolator 10 to barrel-shift its asserted bits. Testing state machine 60 may then determine a number of incremental changes made to the phase of the interpolated signal until the periodically-sampled values resolved to one value. The number may be stored within testing state machine 60 or in a register (not shown) separate from testing state machine 60. The above process may be repeated for at least one other phase degree of the reference clock signal. Next, non-linearity of interpolator 10 may be determined based on the number of incremental changes determined for the first reference clock phase degree and the number of changes determined for the other (at least one) reference clock phase degree. This determination will be described in detail below.

In some embodiments, system 40 resides on a single integrated circuit. Interpolator 10 may comprise an element of a transceiver on such an integrated circuit. One or more elements of testing system 40 may be physically separate from other elements. According to some embodiments, interpolator 10 is an element of an integrated circuit package (e.g., a microprocessor) to be tested, and elements 50 and 60 may comprise hardware and/or software disposed within an external testing device. The external testing device may interface with interpolator 10 through test pins and/or dedicated pins of the integrated circuit package.

Figure 4A:
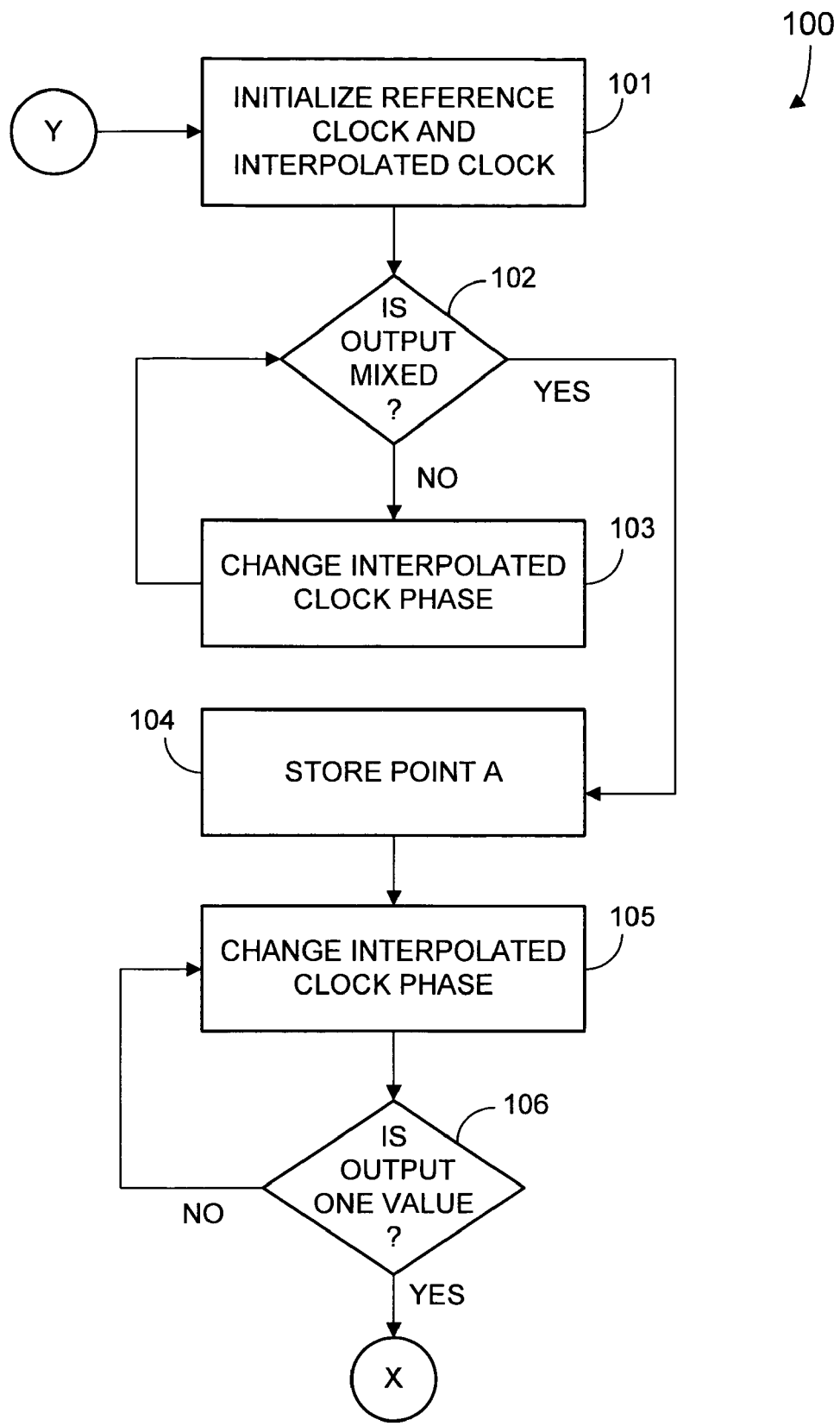
FIGS. 4A and 4B comprise a flow diagram of a testing method according to some embodiments.
Figure 4B:
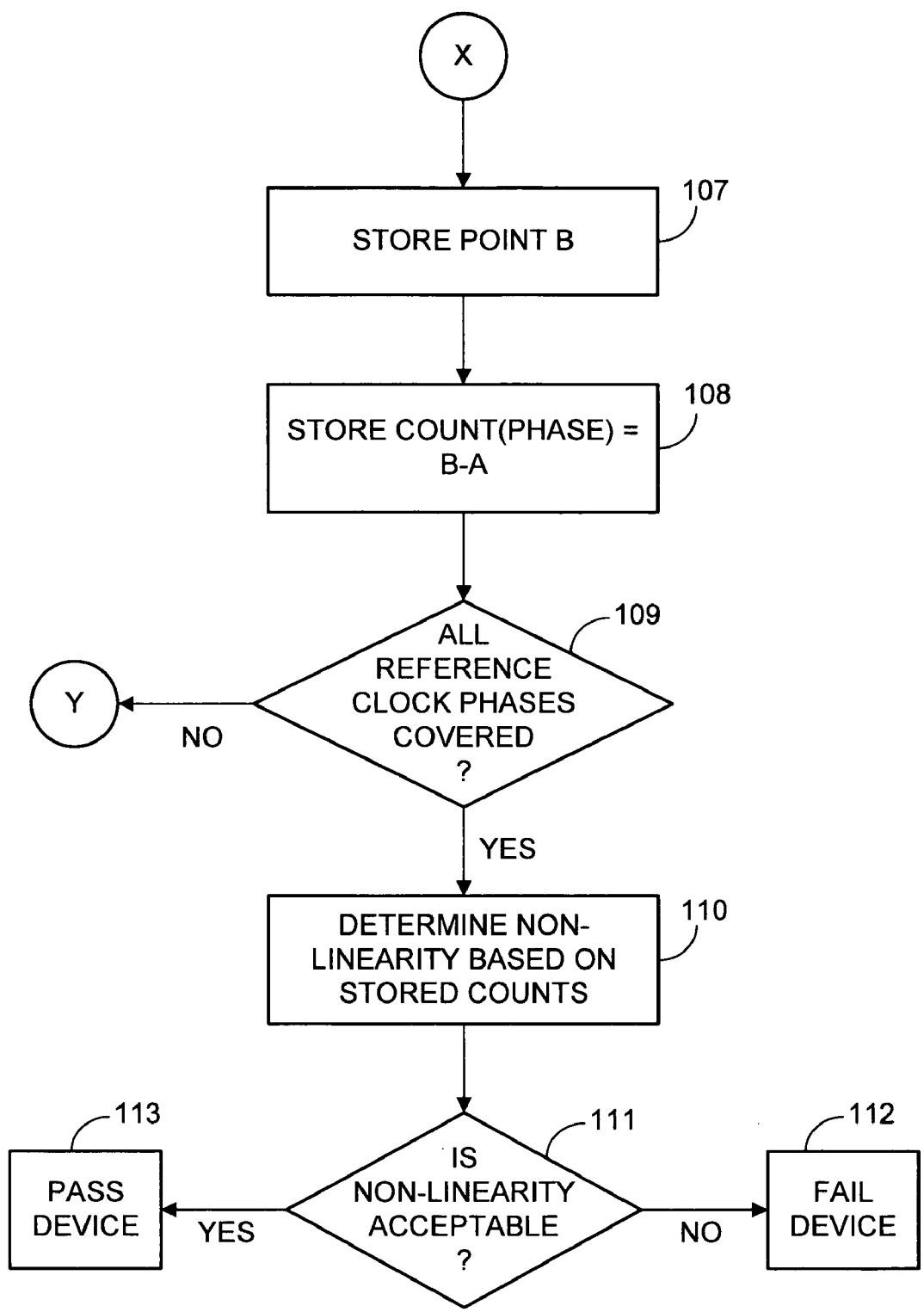

FIGS. 4A and 4B comprise a flow diagram of testing method 100 according to some embodiments. Method 100 may be performed by any suitable combination of hardware and software, and some of method 100 may be performed manually. Method 100 may be used to test interpolator functionality in a high volume manufacturing environment.

The reference clock signal and the interpolated clock signal are initialized at 101. Initialization may comprise procedures used to begin transmission of each signal at substantially identical frequencies. Relative phase degrees of each signal need not be established at 101, although they may be in some embodiments. Initialization of the two clock signals begins periodic sampling of the interpolated clock signal based on the reference clock signal.

Referring to system 40, some embodiments of 101 may comprise asserting particular bits of register 30 and applying bias voltages/currents to other elements of interpolator 10 so as to generate output clock signal CLKOUT. Corresponding procedures may be used to begin generation of the reference clock signal. Some systems for generating the reference clock signal will be described below with respect to FIGS. 7 through 9. After 101, flip-flop 50 of system 40 therefore begins to periodically sample the interpolated clock signal based on the reference clock signal to generate periodically-sampled values.

According to some embodiments of 101, a phase of the reference clock signal is set to a reference phase degree, and a phase of the interpolated clock signal is set to a phase degree different from the reference phase degree. It is then determined that the periodically-sampled values resolve to one value. Such a scenario may be illustrated by diagram c) and diagram d) of FIG. 3. In other words, the phase degree of the interpolated clock signal either leads or lags the reference phase degree by an amount sufficient to comply with the aperture window of flip-flop 50.

Figure 5:
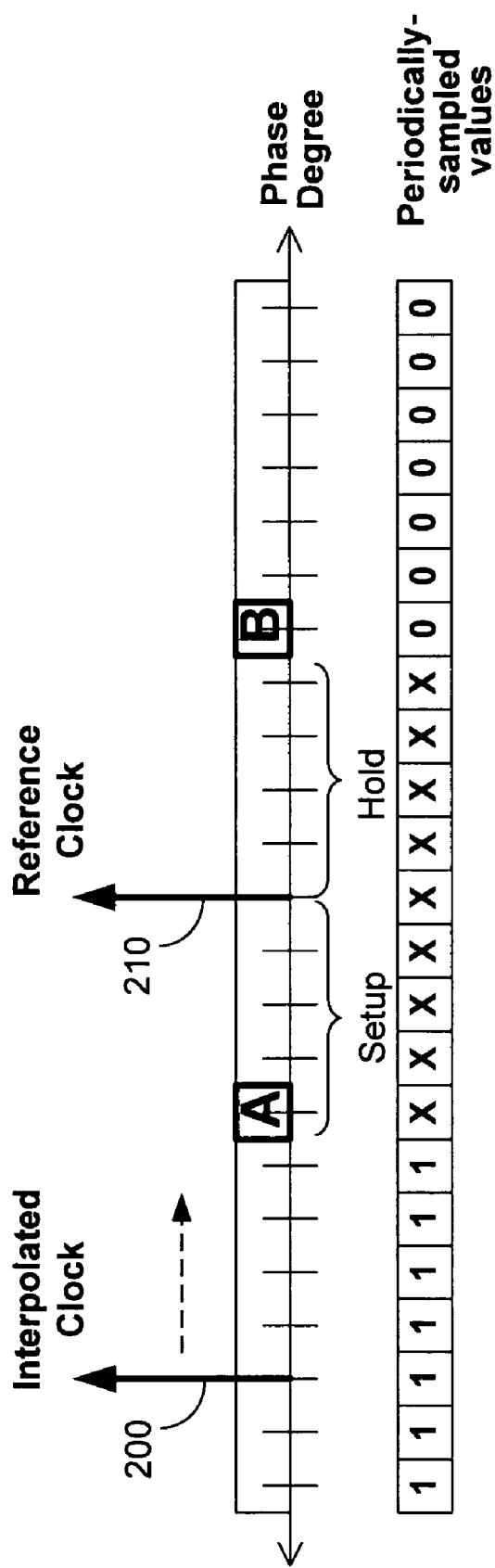
FIG. 5 is a diagram relating an interpolated clock phase to sampled output values according to some embodiments.

FIG. 5 is a diagram to further illustrate a relationship between the phase difference of the two clock signals and the periodically-sampled values according to some embodiments. Arrow 200 represents a phase degree of the interpolated clock signal and arrow 210 represents a phase degree of the reference clock signal after 101. Arrow 200 leads arrow 210 and therefore, as shown in diagram c) of FIG. 3, the periodically-sampled values resolve to the value directly beneath arrow 200, binary 1.

At 102, it is determined if the periodically-sampled values are mixed, i.e., resolve to more than one value. Such a determination would indicate that flip-flop 50 is operating in a metastable state. If the periodically-sampled values are not mixed, the phase of the interpolated clock signal is incrementally changed at 103.

Continuing with the above example, the periodically-sampled values initially resolve to only one value. Therefore, testing state machine 60 incrementally changes the phase of the interpolated clock signal by instructing interpolator 10 to barrel-shift the bits of register 30. In response, arrow 200 of FIG. 5 moves toward the right.

Flow then returns to 102 and continues until it is determined that the periodically-sampled values resolve to more than one value. As shown in FIG. 5, the phase of the interpolated clock signal will be changed several times at 103 until arrow 200 reaches point A. Point A represents a phase degree at which the interpolated clock signal violates the aperture window of flip-flop 50. Accordingly, the periodically-sampled values resolve to more than one value when the phase degree of the interpolated clock signal reaches point A.

Flow continues to 104 if the determination at 102 is positive. Point A is stored at 104. According to some embodiments of 104, testing state machine 60 stores point A at 104 by resetting a counter to 0. The phase degree of the interpolated clock signal is then changed again at 105. This change may be effected as described above, and graphically, may continue to move arrow 200 to the right of point A.

Next, at 106, it is determined if the periodically-sampled values resolve to one value. If not, flow returns to 105 to again change the phase degree of the interpolated clock signal. The above-mentioned counter may be incremented by one each time flow returns to 105. Flow cycles between 105 and 106 until it is determined that the periodically-sampled values resolve to one value.

Returning to the example of FIG. 5, the phase degree of the interpolated clock signal is changed nine times at 105 until the periodically-sampled values resolve to one value, binary 0. The phase degree at this point is indicated by point B of FIG. 5. As shown, point B represents a phase degree at which the interpolated clock signal input to terminal D of flip-flop 50 no longer violates the aperture window of flip-flop 50.

Point B is stored at 107. Next, at 108, a number of incremental changes made to the phase of the interpolated clock signal between point A and point B is determined and stored. This number, or count, reflects a number of incremental changes made to the phase until the periodically-sampled values resolved to one value. The count may be considered as representing the aperture window of the flip-flop 50, expressed in interpolator steps. The count may be stored in association with the current phase degree of the reference clock signal.

Figure 6A:
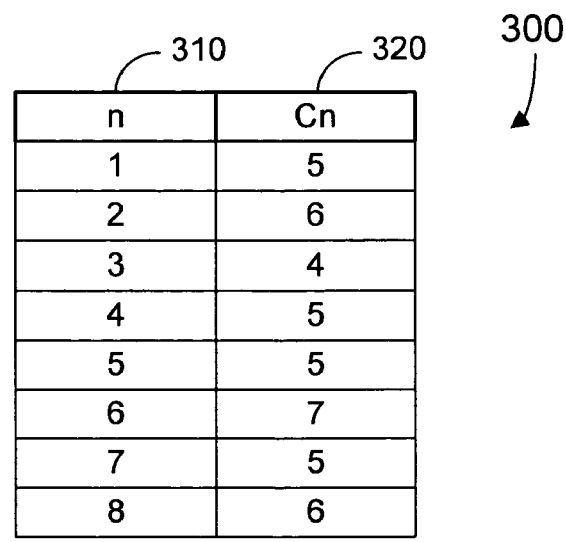
FIG. 6A is a tabular representation of test registers storing test data according to some embodiments.

FIG. 6A is a tabular representation of a portion of a register used to store the count. Register 300 may comprise an element of testing state machine 60 and/or may be integrated into a same integrated circuit die as system 40. In some embodiments, the count may be written to a memory device such as hard disk. Column 310 includes indices to particular reference clock phase degrees, and column 320 specifies counts that are stored at 108 for each phase degree.

After the count is stored, it is determined at 109 whether all reference clock phase degrees have been tested. The determination of 109 depends on the number of available reference clock phase degrees and the number of available phase degrees that are to be tested. Assuming additional phase degrees remain to be tested, flow returns to 101 and continues as described above.

Figure 6B:
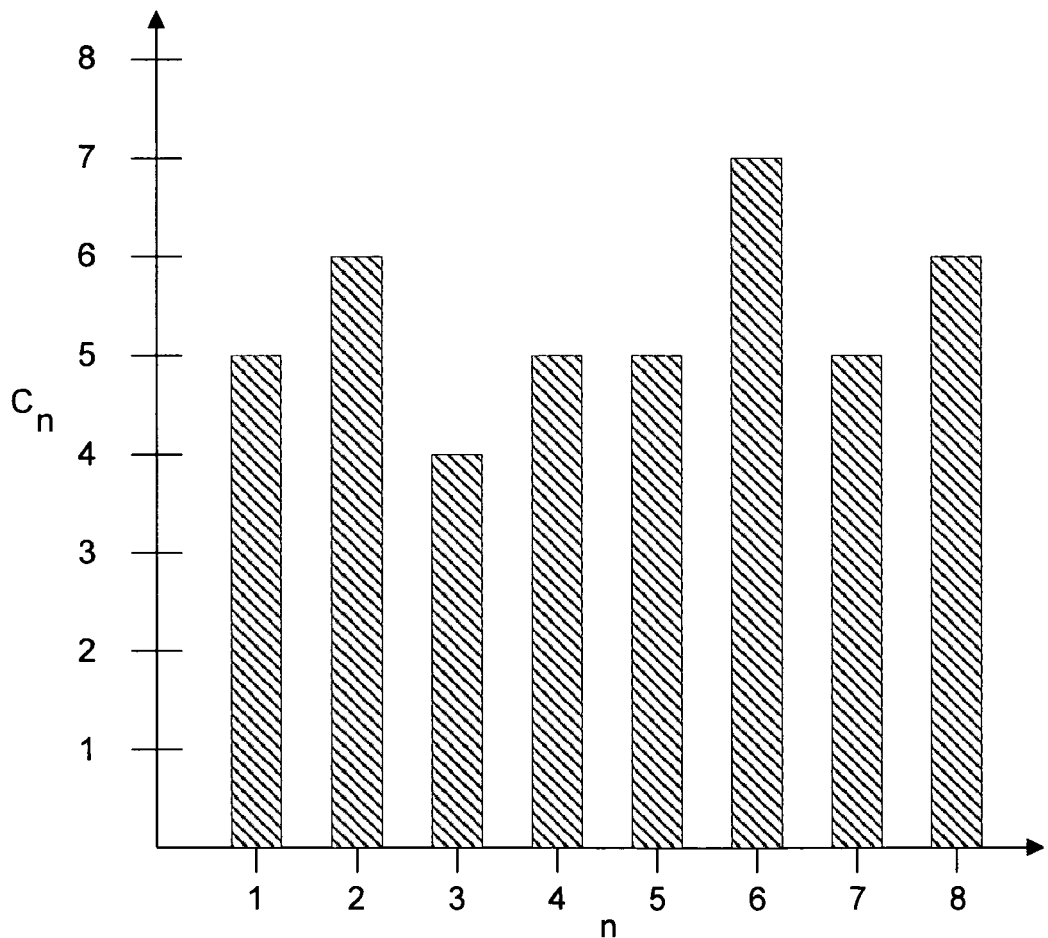
FIG. 6B is a graph of the FIG. 6A test data according to some embodiments.

Therefore, a count is stored at 108 for each tested phase degree of the reference clock signal. Register 300 illustrates the storage of eight counts, each associated with a different reference clock phase degree. The data of register 300 is plotted in FIG. 6B. Flow continues from 109 to 110 after all reference clock phase degrees have been tested. Then, at 110, non-linearity of interpolator 10 is determined based on the stored counts.

The aperture window of flip-flop 50 remains substantially constant for a particular set of environmental conditions, including but not limited to manufacturing process, voltage and temperature. Accordingly, the non-linearity of interpolator 10 may be determined by comparing the counts stored in register 300. For example, each stored count $C_n$ would be equal if interpolator 10 exhibited perfect phase step size with zero non-linearity. Conversely, variations in the measured $C_n$ should be interpreted as a measure of non-linearity in the phase step size of interpolator 10. The maximum non-linearity for interpolator 10 of the present example is bounded by n=3 where four incremental changes are equivalent to the seven incremental changes of at n=6.

To obtain an absolute number (in time units) for the non-linearity, some embodiments store the actual phase degree of the interpolated clock at point A, and the actual phase degree of the interpolated clock at point B of FIG. 5. The real-time distance between the two phase degrees is substantially equally to the aperture window of flip-flop 50. The measured aperture window may be divided by the count $C_n$ to determine the average interpolator step size for iteration n.

For example, if the measured aperture window is 40 ps then the phase step size for n=3 is 10 ps and the phase step size for n=6 is 5.7 ps. Hence it can be inferred that the phase step size non-linearity is 10−5.7=4.3 ps. Measurement of the absolute aperture window is not needed for every interpolator under test. A few exemplary samples can be characterized to estimate an empirical threshold level in a high volume manufacturing environment.

Regardless of how the non-linearity is determined at 110, the non-linearity is deemed acceptable or unacceptable at 111. For example, the non-linearity may be compared against a threshold level of non-linearity. Interpolator 10 is failed at 112 if its non-linearity is unacceptable, and passed at 113 if its non-linearity is acceptable.

Figure 7:
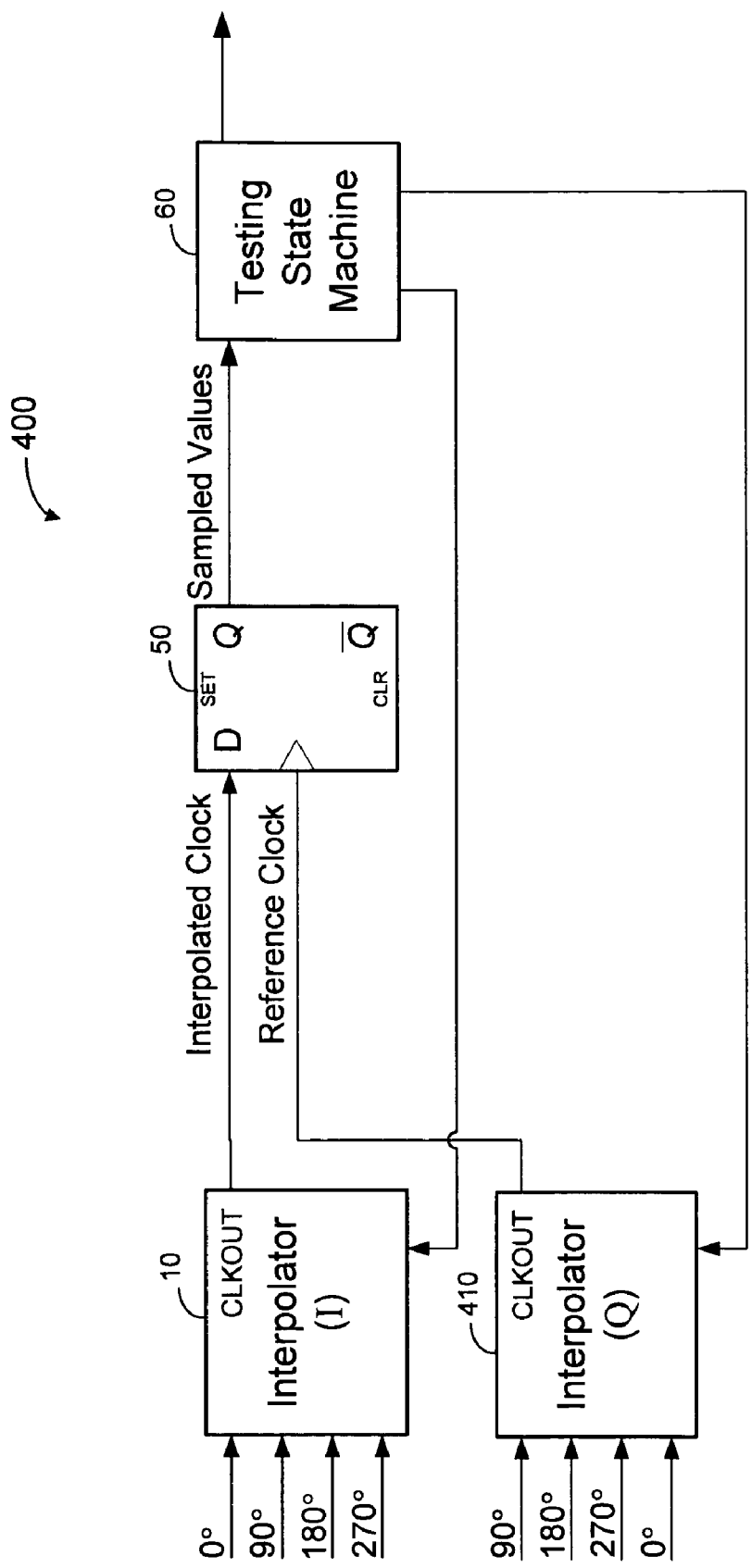
FIG. 7 is a block diagram of a testing device according to some embodiments.

FIG. 7 is a block diagram of testing system 400 according to some embodiments. Testing system 400 includes interpolator 10, flip-flop 50, testing state machine 60, and second interpolator 410. Testing system 400 may operate to determine the non-linearity of interpolator 10, using method 100 or any other suitable method.

Interpolator 10, flip-flop 50, testing state machine 60 may operate and be embodied as described above with respect to FIG. 2 and method 100. During normal (non-test) operation, second interpolator 410 is "in quadrature" with interpolator 10. In other words, a phase of signal CLKOUT from second interpolator 410 lags a phase of signal CLKOUT from interpolator 10 by 90°. This relationship may be changed during testing as described above. Two thusly-related interpolators may be used in a transceiver that extracts embedded clock information from data streams. Accordingly, testing system 400 may be integrated into a single integrated circuit die.

Second interpolator 410 provides the reference clock signal as described above. Testing state machine 60 is coupled to second interpolator 410. In some embodiments, testing state machine 60 instructs second interpolator 410 to change the phase degree of the reference clock signal at 101 of method 100. Such an arrangement may provide testing of interpolator 10 using existing circuitry to generate the multiple reference clock phase degrees.

Figure 8:
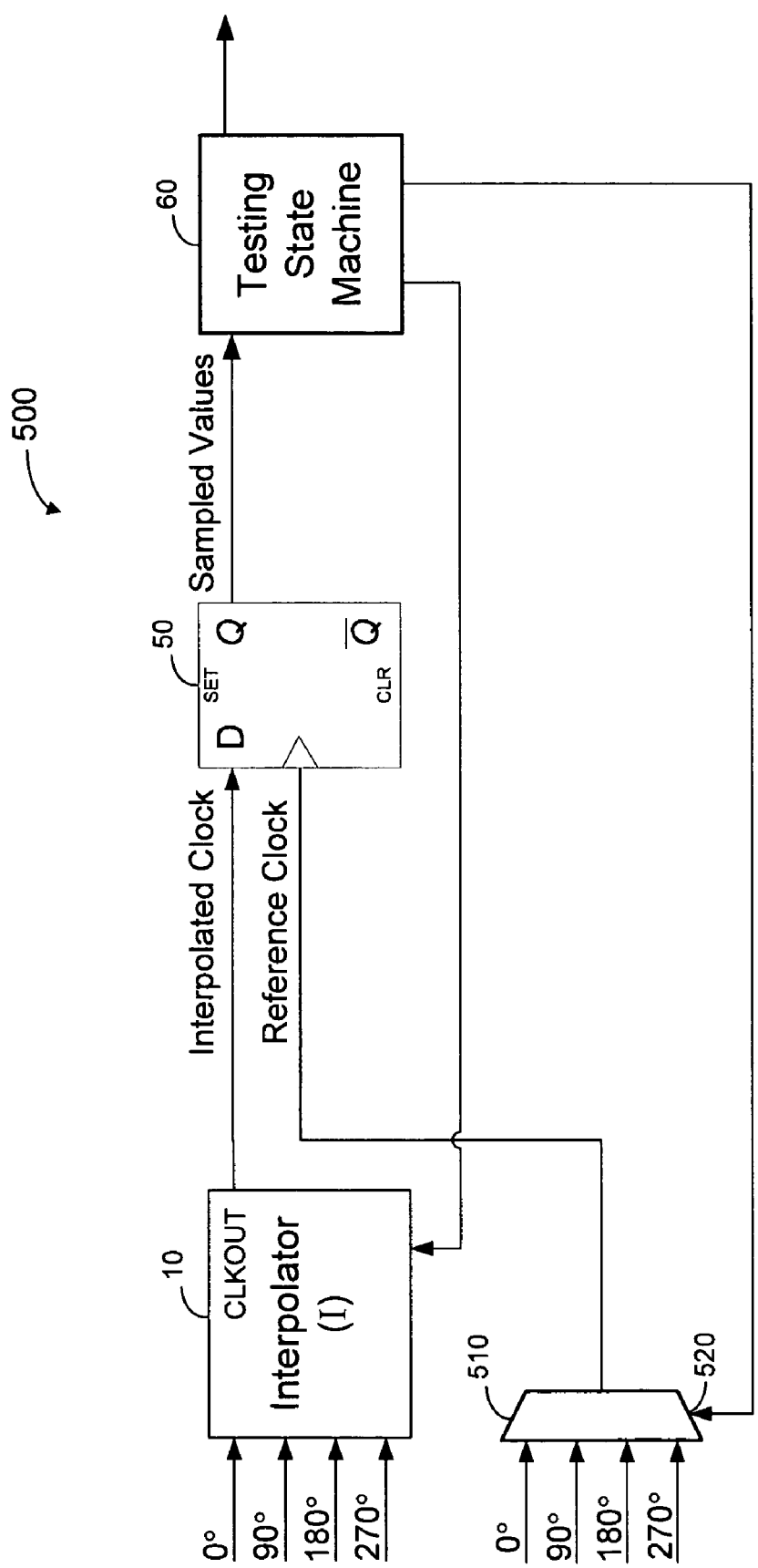
FIG. 8 is a block diagram of a testing device according to some embodiments.

FIG. 8 is a block diagram of testing system 500 according to some embodiments. Testing system 500 includes interpolator 10, flip-flop 50, testing state machine 60, and multiplexer 510. Testing system 500 may operate to determine the non-linearity of interpolator 10, using method 100 or any other suitable method.

Interpolator 10, flip-flop 50, testing state machine 60 may operate and be embodied as described above with respect to FIG. 2 and method 100. Multiplexer 510 receives two or more clock signals and provides one of the clock signals to flip-flop 50 as the reference clock signal. Multiplexer 510 includes input 520 by which testing state machine 60 may select the one of the two or more clock signals that will be provided as the reference clock. In this regard, testing state machine 60 may select a new clock signal at 101 of method 100. Multiplexer 510 may be located on a same integrated circuit die as the other elements of system 500.

Figure 9:
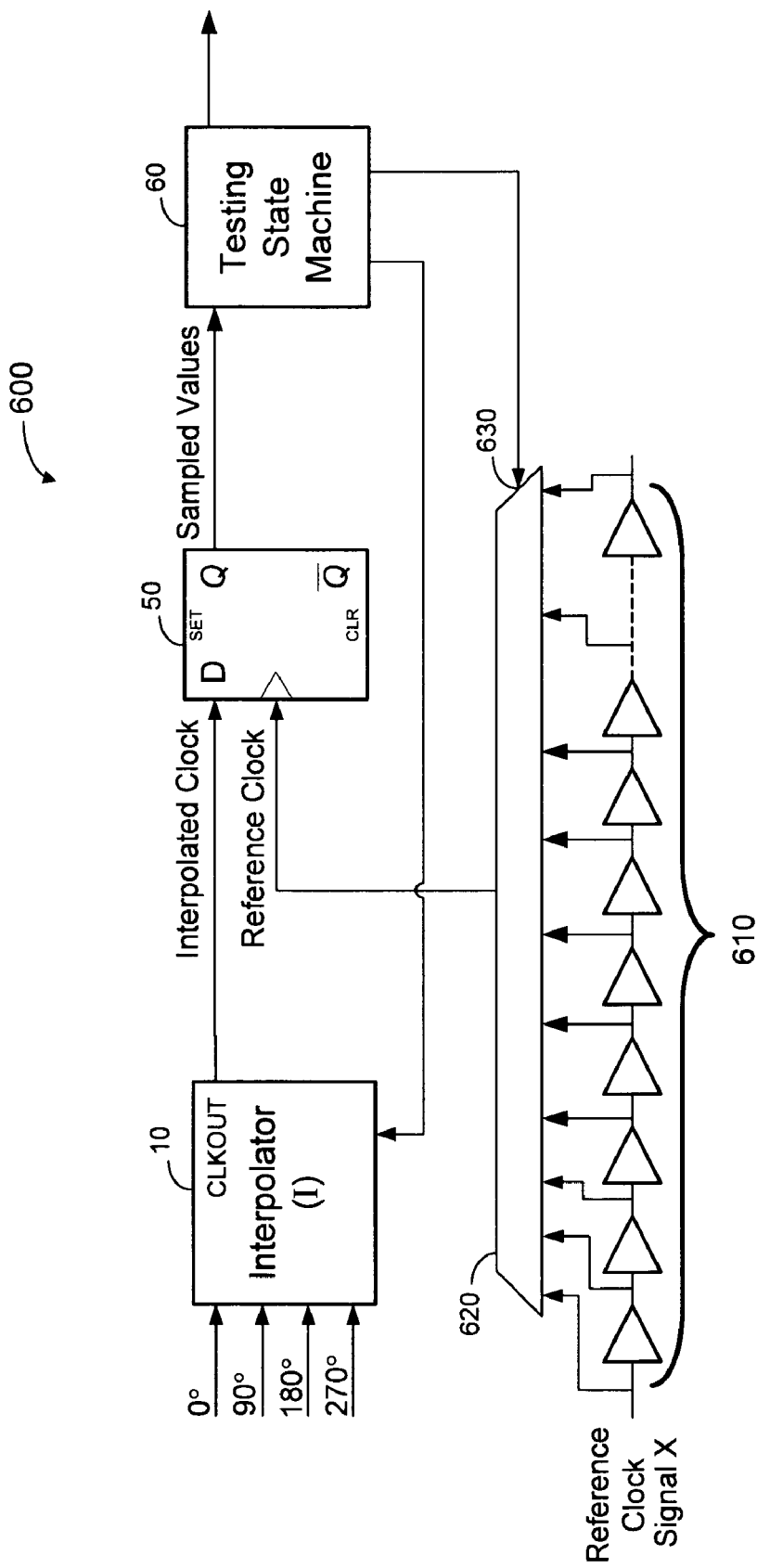
FIG. 9 is a block diagram of a testing device according to some embodiments.

FIG. 9 is a block diagram of testing system 600 according to some embodiments. Testing system 600 includes interpolator 10, flip-flop 50, testing state machine 60, serially-coupled buffers 610, and multiplexer 620. Testing system 600 may operate to determine the non-linearity of interpolator 10, using method 100 or any other suitable method.

Again, interpolator 10, flip-flop 50, testing state machine 60 may operate and be embodied as described above with respect to FIG. 2 and method 100. Buffers 610 and multiplexer 620 may combine to provide a reference clock signal to flip-flop 50. In some embodiments, buffers 610 and multiplexer 620 each receive reference clock signal X, and multiplexer 620 also receives an output signal from each of buffers 610. The clock phase of a signal output by a particular buffer may differ from the clock phase of a signal output by each other buffer. In some embodiments, each of buffers 610 provides a substantially equal signal propagation delay. Therefore, increments between the different clock phases may be substantially equal.

Multiplexer 620 includes input 630 by which testing state machine 60 may select which of the received clock signals will be provided to flip-flop 50 as the reference clock. Testing state machine 60 may select a new clock signal at 101 of method 100. Buffers 610 and multiplexer 620 may be located on a same integrated circuit die as the other elements of system 600.

Figure 10:
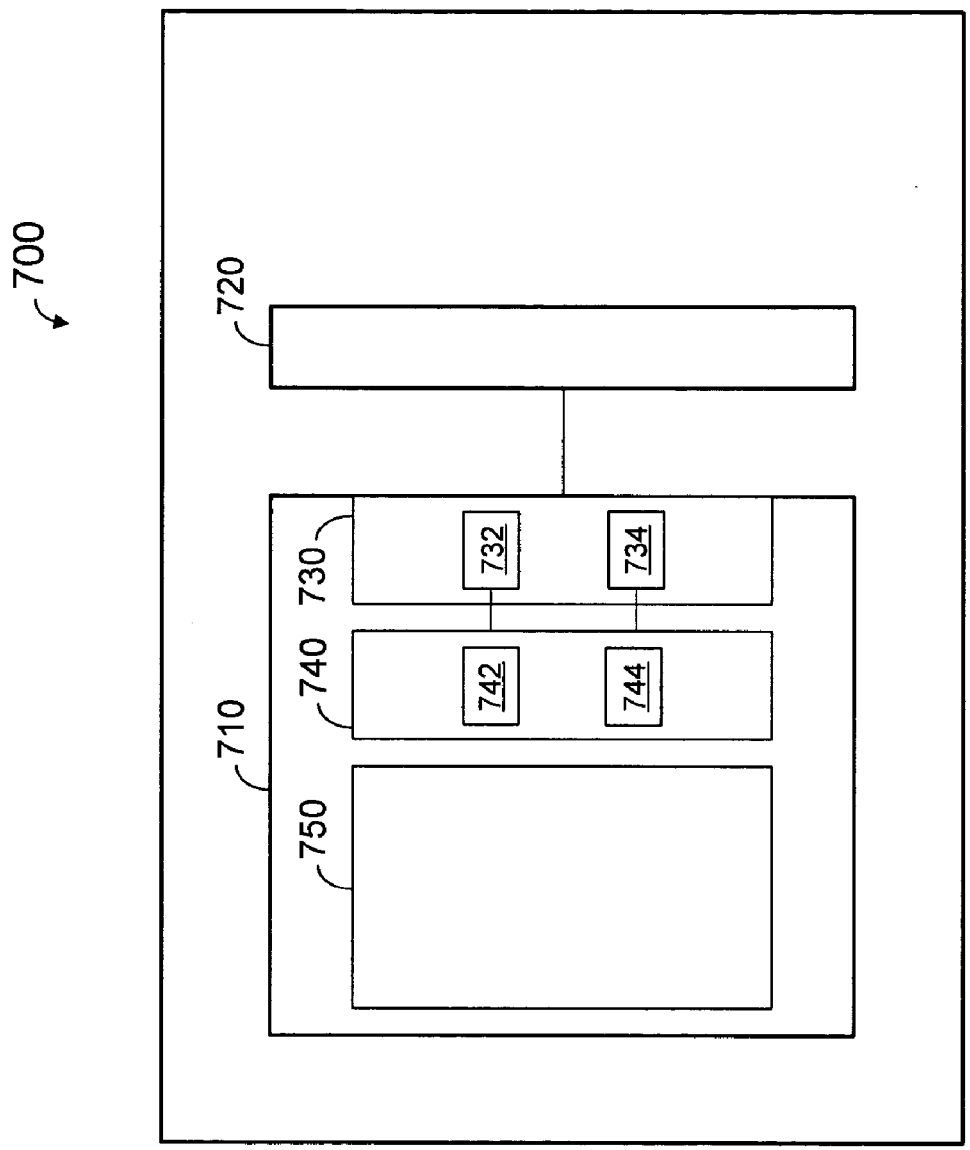
FIG. 10 is a block diagram of a system according to some embodiments.

FIG. 10 is a block diagram of system 700 according to some embodiments. System 700 may comprise a motherboard. System 700 includes integrated circuit 710, which may comprise a microprocessor. Microprocessor 710 is coupled to memory 720, which may comprise any type of memory for storing data, such as a Single Data Rate Random Access Memory, a Double Data Rate Random Access Memory, a fully buffered Dual In-line Memory Module, or a Programmable Read Only Memory.

Microprocessor 710 includes transceiver 730 having interpolators 732 and 734. Transceiver 730 may provide serial I/O functions, including but not limited to direct memory access. Interpolators 732 and 734 of transceiver 730 may be in quadrature with one another. Testing unit 740 may be used to determine the non-linearity of interpolators 732 and 734 as described herein. Accordingly, testing unit 740 comprises flip-flop 742 and testing state machine 744. Microprocessor 710 also includes core 750 for providing primary functions of microprocessor 710.

The several embodiments described herein are solely for the purpose of illustration. Some embodiments may incorporate, in part or in whole, any currently or hereafter-known interpolators, flip-flops, state machines, and other elements. Therefore, persons in the art will recognize from this description that other embodiments may be practiced with various modifications and alterations.

What is claimed is:

1. A method comprising:
   interpolating a clock signal;
   receiving the interpolated clock signal having a first frequency;
   periodically sampling the interpolated clock signal based on a reference clock signal to generate a first plurality of periodically-sampled values, the reference clock signal having substantially the first frequency;
   setting a phase of the interpolated clock signal to a phase degree at which a second plurality of periodically-sampled values includes more than one value; and
   incrementally changing the phase of the interpolated clock signal until a third plurality of periodically-sampled values includes only one value.

2. A method according to claim 1, further comprising:
   changing a phase of the reference clock signal;
   periodically sampling the interpolated clock signal based on the changed reference clock signal to generate a fourth plurality of periodically-sampled values;
   setting the interpolated clock signal to a second phase degree at which a fifth plurality of periodically-sampled values includes more than one value; and
   incrementally changing the phase of the interpolated clock signal until a sixth plurality of periodically-sampled values includes only one value.

3. A method according to claim 2, further comprising:
   determining a first number of incremental changes made to the phase of the interpolated clock signal until a seventh plurality of periodically-sampled values included only one value; and
   determining a second number of incremental changes made to the phase of the interpolated clock signal until an eighth plurality of periodically-sampled values included only one value.

4. A method according to claim 3, further comprising:
   determining a non-linearity of the interpolated clock signal based on the first number and the second number.

5. A method according to claim 1, further comprising:
   determining a number of incremental changes made to the phase of the interpolated clock signal until a fourth plurality of periodically-sampled values included only one value.

6. A method according to claim 1, wherein setting the phase of the interpolated clock signal to a phase degree at which a fifth plurality of periodically-sampled values includes more than one value comprises:
   setting a phase of the reference clock signal to a reference phase degree;
   setting a phase of the interpolated clock signal to a different phase degree, the different phase degree being different from the reference phase degree;
   determining that a fourth plurality of periodically-sampled values includes only one value; and
   incrementally changing the phase of the interpolated clock signal until a fifth plurality of periodically-sampled values includes more than one value.

7. An apparatus comprising:
   an interpolator to generate an interpolated clock signal;
   a reference clock generator to generate a reference clock signal;
   a sampler to input the interpolated clock signal, input the reference clock signal, and periodically sample the interpolated clock signal based on the reference clock signal to generate a first plurality of periodically-sampled values; and
   a device coupled to the interpolator and to receive a first plurality of periodically-sampled values, the device to incrementally change a phase of the interpolated clock signal, and to determine whether a second plurality of periodically-sampled values includes only one value or whether the second plurality of periodically-sampled values includes more than one value.

8. An apparatus according to claim 7, the device to determine a number of incremental changes made to the phase of the interpolated clock signal from a point at which the first plurality of periodically-sampled values included more than one value until a point at which the second plurality of periodically-sampled values included only one value.

9. An apparatus according to claim 8, wherein the interpolator, reference clock generator, the sampler and the device are integrated within a single integrated circuit die.

10. An apparatus according to claim 7, the device to change a phase of the reference clock signal, the sampler to periodically sample the interpolated clock signal based on the changed reference clock signal to generate a third plurality of periodically-sampled values incrementally change a phase of the interpolated clock signal, and the device to determine whether the third plurality of periodically-sampled values include only one value or whether the periodically-sampled values includes more than one value.

11. An apparatus according to claim 10, the device to determine a second number of incremental changes made to the phase of the interpolated clock signal from a point at which the third plurality of periodically-sampled values included more than one value until a point at which the third plurality of periodically-sampled values included only one value.

12. An apparatus according to claim 11, the device to determine a non-linearity of the interpolated clock signal based on the number and the second number.

13. An apparatus according to claim 7, the reference clock generator comprising:
    a second interpolator in quadrature with the interpolator to generate the reference clock signal.

14. An apparatus according to claim 7, the reference clock generator comprising:
    a multiplexer to receive a plurality of clock signals, the multiplexer comprising an input to select one of the plurality of clock signals as the reference clock signal.

15. An apparatus according to claim 7, the reference clock generator comprising:
    a plurality of serially-coupled buffers to provide substantially equal signal propagation delay; and
    a multiplexer coupled to an output of each of the plurality of serially-coupled buffers, the multiplexer comprising an input to select one of the plurality of outputs as the reference clock signal.

16. An apparatus according to claim 7, wherein the interpolator, reference clock generator, the sampler and the device are integrated within a single integrated circuit die.

17. A system comprising:
    a microprocessor comprising:
        an interpolator to generate an interpolated clock signal;
        a reference clock generator to generate a reference clock signal;
        a sampler to periodically sample the interpolated clock signal based on the reference clock signal to generate a first plurality of periodically-sampled values; and
        a device to incrementally change a phase of the interpolated clock signal, and to determine whether a second plurality of periodically-sampled values includes only one value or whether the second plurality of periodically-sampled values includes more than one value; and
    a fully-buffered dual in-line memory module coupled to the microprocessor.

18. A system according to claim 17, the device to determine a number of incremental changes made to the phase of the interpolated clock signal from a point at which the third plurality of periodically-sampled values included more than one value until a point at which the fourth plurality of periodically-sampled values included only one value.

19. A system according to claim 17, the reference clock generator comprising:
    a multiplexer to receive a plurality of clock signals, the multiplexer comprising an input to select one of the plurality of clock signals as the reference clock signal.

20. A system according to claim 17, the reference clock generator comprising:
    a plurality of serially-coupled buffers to provide substantially equal signal propagation delay; and
    a multiplexer coupled to an output of each of the plurality of serially-coupled buffers, the multiplexer comprising an input to select one of the plurality of outputs as the reference clock signal.

* * * * *